United States Patent [19]

Turner et al.

[11] Patent Number: 5,491,107
[45] Date of Patent: Feb. 13, 1996

[54] SEMICONDUCTOR PROCESSING METHOD FOR PROVIDING LARGE GRAIN POLYSILICON FILMS

[75] Inventors: Charles L. Turner; Monte Manning, both of Boise, Id.

[73] Assignee: Micron Technology, Inc., Boise, Id.

[21] Appl. No.: 426,639

[22] Filed: Apr. 21, 1995

Related U.S. Application Data

[63] Continuation of Ser. No. 7,546, Jan. 21, 1993, abandoned.

[51] Int. Cl.$^6$ ........................................... H01L 21/22
[52] U.S. Cl. ..................... 437/162; 437/161; 437/247; 148/DIG. 1
[58] Field of Search ............................... 437/101, 134, 437/138, 139, 160, 161, 162, 164, 233, 247, 950, 967, 973; 148/DIG. 1, DIG. 122, DIG. 144

[56] References Cited

U.S. PATENT DOCUMENTS

| 5,183,777 | 2/1993 | Doki et al. | 437/160 |
| 5,310,698 | 5/1994 | Wild | 437/162 |

FOREIGN PATENT DOCUMENTS

| 3504184 | 8/1986 | Germany | 437/233 |
| 0005518 | 1/1988 | Japan | 437/160 |
| 0166220 | 7/1988 | Japan | 437/160 |

OTHER PUBLICATIONS

Aoyama et al., "Leakage Currents Reduction of Poly–Si TFT's by Two Step Annealing", Extended Abstracts of the 22nd (1990 International) Conference on Sol. St. Dev. and Materials, pp. 389–392.

Gorkum et al., "Controlled Atomic Layer Doping and ALD MOSFET Fabrication in Si", Japanese Journal of Applied Physics, vol. 26, No. 12, pp. L1933–L1935, Dec. 1987.

Gong et al., "A metal–oxide–silicon field–effect transistor made by means of solid–phase doping", J. Appl. Phys., 65(11), pp. 4435–4437, Jun. 1989.

C. V. Thomoson, "Grain Growth In Polycrystalline Silicon Films" Dept. of Materials Science and Engineering, Massachusetts Institute of Technology, Cambridge, MA. Mat. Res. Soc. Symp. Proc. vol. 106, 1988.

*Primary Examiner*—Chandra Chaudhari
*Attorney, Agent, or Firm*—Wells, St. John, Roberts, Gregory & Matkin

[57] ABSTRACT

A semiconductor processing method of providing a polysilicon layer atop a semiconductor wafer comprises the following sequential steps: a) depositing a first layer of arsenic atop a semiconductor wafer; b) depositing a second layer of silicon over the arsenic layer, the second layer having an outer surface; c) first annealing the wafer at a temperature of at least about 600° C. for a time period sufficient to impart growth of polycrystalline silicon grains in the second layer and providing a predominately polysilicon second layer, the first annealing step imparting diffusion of arsenic within the second layer to promote growth of large polysilicon grains; and d) with the second layer outer surface being outwardly exposed, second annealing the wafer at a temperature effectively higher than the first annealing temperature for a time period sufficient to outgas arsenic from the polysilicon layer. As an alternate consideration, the layer of silicon could be in situ provided with an effective quantity of As during deposition.

16 Claims, 2 Drawing Sheets

SEMICONDUCTOR PROCESSING METHOD FOR PROVIDING LARGE GRAIN POLYSILICON FILMS

This application is a continuation of Ser. No. 08/007,546, filed on 21, 1993, now abandoned.

TECHNICAL FIELD

This invention relates generally to polysilicon layers in semiconductor wafer processing, and more particularly to increasing or enhancing the size of polysilicon grains within a polysilicon layer.

BACKGROUND OF THE INVENTION

It is desirable in formation of polysilicon films to provide large individual polysilicon grains to maximize resultant conductance upon impurity doping. The desire for large polysilicon grains is even greater in fabrication of thin-film-transistors (commonly referred to as "TFTs") which typically have a thickness of from about 100 Angstroms to around 2000 Angstroms.

Polysilicon can be provided atop a semiconductor wafer by direct deposition or deposition of amorphous polysilicon followed by a crystallization anneal. Another technique employs "recrystallization" of a polysilicon film, whether that film be polycrystalline as deposited or initially rendered so by a post-amorphous deposition anneal. "Recrystallization" refers to the nucleation and growth of new grains within a preexisting crystalline matrix that has been made amorphous, or to grain enlargement of preexisting grains. It is typically undesirable to directly deposit polysilicon, as such deposition inherently results in very small grains, large numbers of grain boundaries, and other undesired defects. Grain growth and size can be maximized by amorphous silicon deposition followed by crystallization anneal, or by recrystallization techniques. Larger grains result from these processes as opposed to mere direct deposition of polysilicon.

This invention comprises an improved technique for enhancing or enlarging the size of polysilicon grains in a polysilicon film.

BRIEF DESCRIPTION OF THE DRAWINGS

Preferred embodiments of the invention are described below with reference to the following accompanying drawing.

DETAILED DESCRIPTION OF THE PREFERRED EMBODIMENTS

Figure 1:
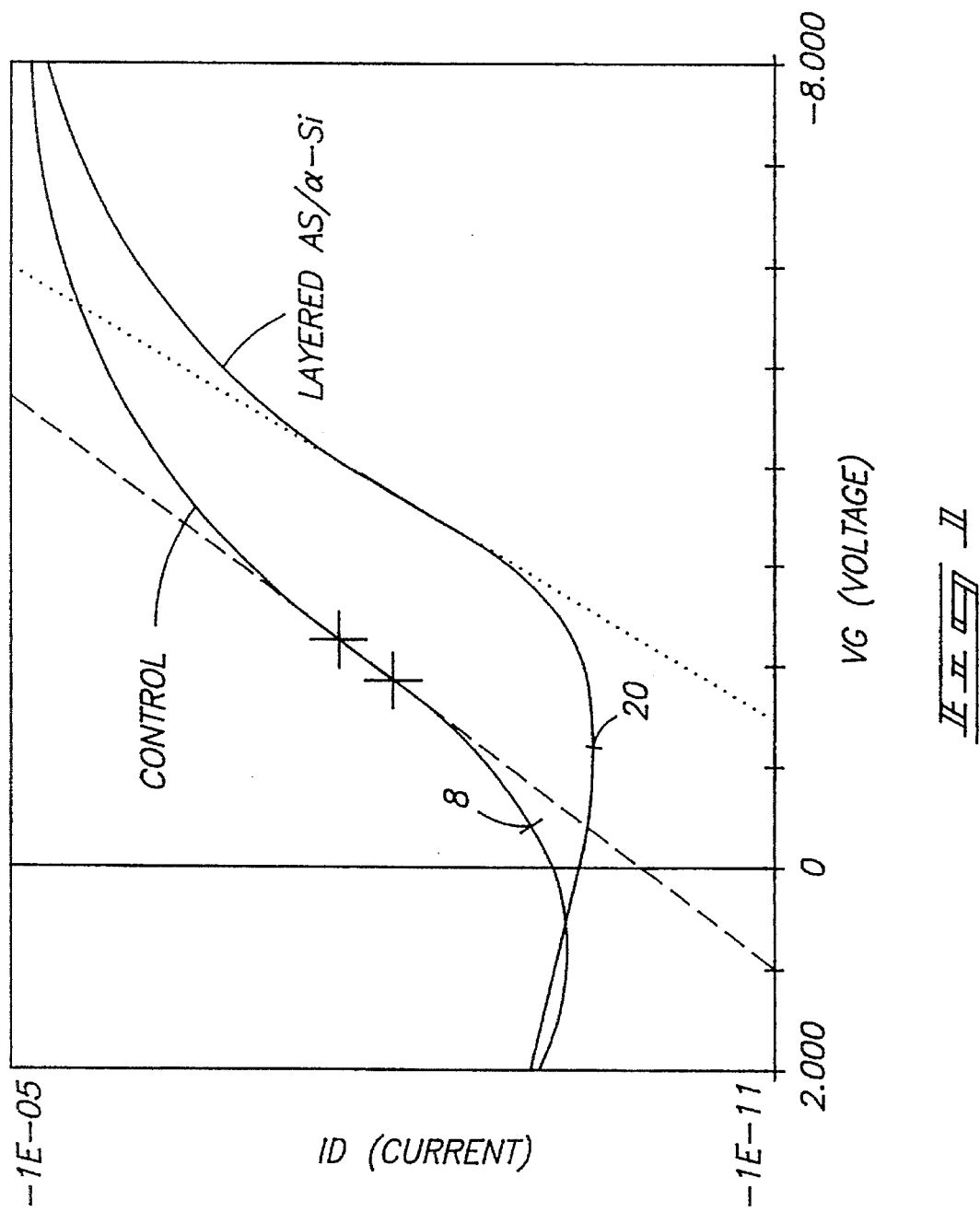
FIG. 1 is a logarithmic plot of current vs. voltage for a control polysilicon thin film transistor and a polysilicon thin film transistor produced in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing a polysilicon layer atop a semiconductor wafer comprises the following sequential steps:

depositing a first layer of arsenic atop a semiconductor wafer; depositing a second layer of silicon over the arsenic layer, the second layer having an outer surface;

first annealing the wafer at a temperature of at least about 550° C. for a time period sufficient to impart growth of polycrystalline silicon grains in the second layer and providing a predominately polysilicon second layer, the first annealing step imparting diffusion of arsenic within the second layer to promote growth of large polysilicon grains; and with the second layer outer surface being outwardly exposed, second annealing the wafer for a time period sufficient to outgas arsenic from the polysilicon layer.

It is believed that the first layer of arsenic should be deposited to a thickness of less than or equal to about 20 Angstroms. Preferably, the first layer thickness can be less than or equal to about 5 Angstroms, with from about 1 Angstrom to about 2 Angstroms believed to be most preferred. The intent is to provide sufficient arsenic within the silicon layer (whether such layer be amorphous silicon or polycrystalline silicon) to enhance or promote an increase in the size of individual polysilicon grains grown within the silicon layer during the first annealing step. It is believed that the quantity of arsenic atoms within the silicon layer should be at least about $1\times10^{17}$ atoms/cm$^3$, with a concentration of from about $1\times10^{19}$ atoms/cm$^3$ to about $1\times10^{20}$ atoms/cm$^3$ being most preferred. It has been discovered that an essentially directly immeasurable thick layer of arsenic, less than 2 Angstroms for a 600 Angstrom thick amorphous Si film, produces a desired effect of large grain growth as evidenced by an increase in slope on a logarithmic plot of current vs. voltage. Such represents faster voltage on/voltage off switching, evidencing an increase in grain size.

Arsenic is an n-type dopant material capable in sufficient quantities of desirably rendering a polysilicon region electrically conductive. However, the preferred $10^{19}$ to $10^{20}$ concentration levels are excessive and typically would be undesired high concentrations in a finished polysilicon layer used for thin film transistors, or for p+ doped polysilicon. More typical desired concentrations of dopant material for thin film transistors are from about $1\times10^{15}$ atoms/cm$^3$ to about $1\times10^{17}$ atoms/cm$^3$.

The arsenic layer would typically be deposited by low pressure chemical vapor deposition (LPCVD) at a temperature greater than 450° C. and a pressure from 1 mTorr to 1 Torr. Amorphous silicon can be deposited by LPCVD techniques at temperatures less the 585° C., while polycrystalline silicon (polysilicon) can be directly deposited by LPCVD techniques at temperatures greater than 550° C.

The invention is expected to have its greatest advantageous application in situations where grain size is the most critical, that being with respect to very thin polysilicon layers such as utilized in thin film transistor technology. The thickness of the thin films for such transistors is typically from about 100 Angstroms to about 2000 Angstroms. About 450 Angstroms is presently typical for SRAM applications. Aspects of the invention in promoting the size of individual polysilicon grain growth will become even more important as thinner polysilicon films are utilized in the next generation levels of miniaturization.

Amorphous/polycrystalline phase changes in silicon typically occur at a processing temperature of around 585° C. Accordingly, an annealing of an amorphous silicon layer for a sufficient period of time above this temperature, such as at least about 600° C., will crystallize an amorphous silicon layer into polysilicon. The amount of time necessary for such crystallization depends upon the temperature employed, and the thickness of the amorphous silicon film being treated. Where the film is to be utilized for a thin film transistor, having a thickness of from about 300 Angstroms to about 400 Angstroms, a temperature of about 600° C. is preferred, with exposure to such temperature for approximately 12 hours being sufficient to result in the crystallization. Higher temperatures would require less time. During such an annealing step, arsenic atoms will diffuse into and throughout the silicon layer and thereby impart growth of large polysilicon grains.

"Recrystallization" of a layer of polycrystalline silicon as-deposited will occur at higher temperatures, such as 950° C. for thirty minutes. During such an annealing step, arsenic would diffuse from the arsenic layer to and within the second layer to promote growth of large polysilicon grains. To prevent outgasing of such arsenic during such first annealing step, a masking material can be provided atop the silicon layer. Example masking materials would be oxides and nitrides.

It is not believed that appreciable arsenic diffuses into the silicon layer during its deposition, but rather that diffusion into such layer occurs during the crystallization or recrystallization anneals.

Figure 2:
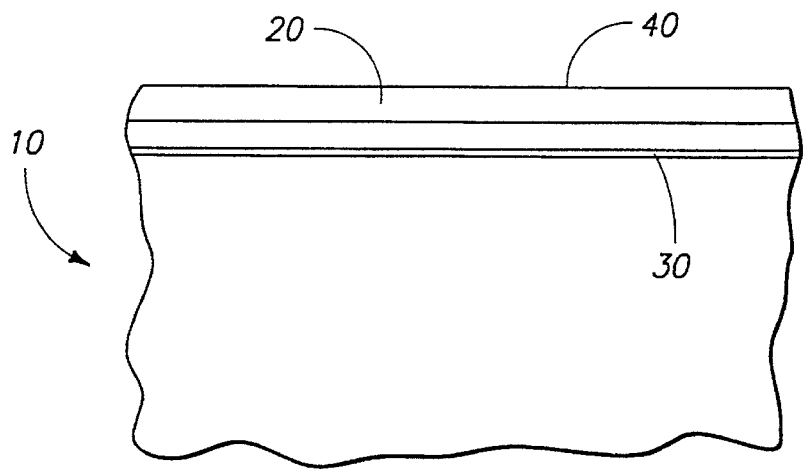
FIG. 2 is a cutaway side view of a semiconductor wafer which has been treated according to an embodiment of the process of this invention. The wafer in FIG. 2 is shown immediately after a layer of silicon is applied over a layer of arsenic which is on the surface of the wafer.
Figure 3:
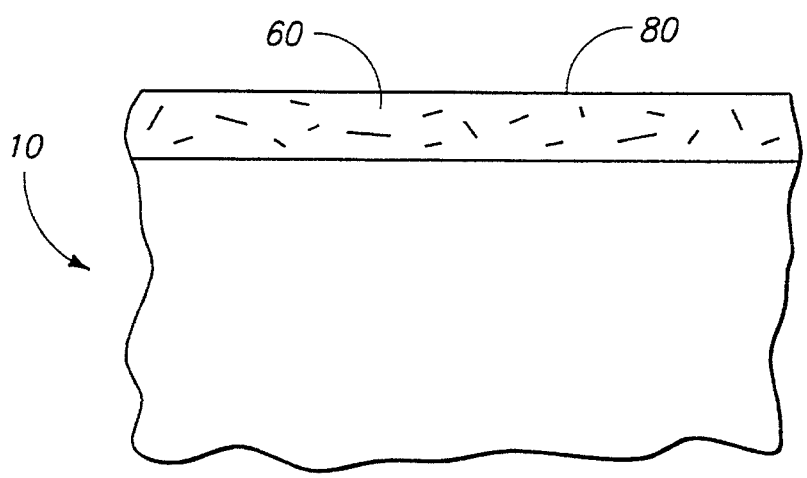
FIG. 3 is a cutaway side view of a semiconductor wafer which has been treated according to an embodiment of the process of this invention. The wafer in FIG. 3 is shown subsequent to a first annealing step but prior to an outgassing step.

FIG. 1 illustrates a comparison between a control polysilicon film and a film processed in accordance with the invention. Such a graph represents a logarithmic plot of drain current versus gate voltage for such films. The control film was initially deposited to a thickness of from about 400 Angstroms to about 500 Angstroms, and was undoped and amorphous as deposited. It was crystallized at a temperature of about 600° C. for 24 hours. The crystallized film was then doped with phosphorus at a dose of $5\times10^{12}$. The layered (inventive) film was provided by first depositing a thin layer of arsenic under LPCVD conditions for 30 minutes. Next, silicon was deposited under LPCVD conditions at less than 585° C. to a thickness of from about 400 Angstroms to about 500 Angstroms, such that an amorphous silicon layer resulted. A side view of a wafer 10, shown after silicon deposition on the wafer, is illustrated in FIG. 2. A layer of arsenic 30 is on wafer 10. A layer of amorphous silicon 20 is over the layer of arsenic 30. The layer of amorphous silicon 20 has an outer surface 40. The wafer with amorphous silicon layer was annealed at about 600° C. for 24 hours to impart crystallization. A side view of a wafer 10, shown after the first annealing step, is illustrated in FIG. 3. A crystallized polysilicon layer 60 is on wafer 10, and arsenic atoms from layer 30 are interspersed within this polysilicon layer. The polysilicon layer 60 has an outer surface 80.

Figure 4:
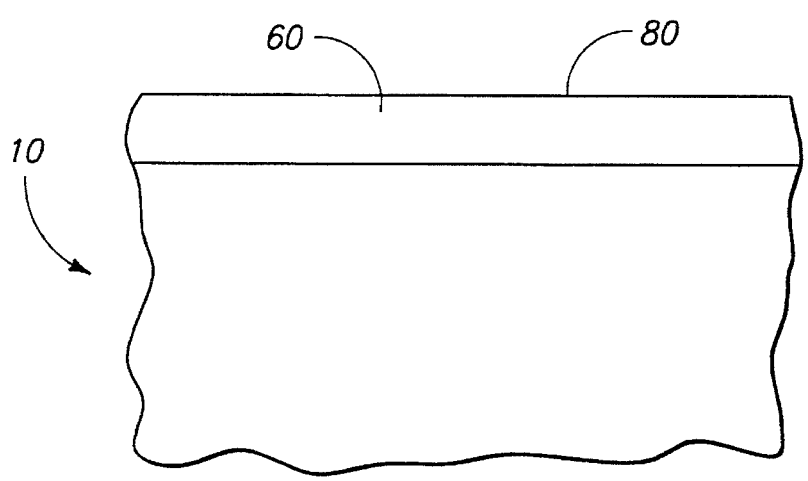
FIG. 4 is a cutaway side view of a semiconductor wafer which has been treated according to an embodiment of the process of this invention. The wafer in FIG. 4 is shown subsequent to an outgassing step.

With the outer surface of the crystallized layer being outwardly exposed, a second anneal of the wafer is conducted for a time period sufficient to outgas arsenic from the polysilicon layer. A side view of a wafer 10, shown after the outgassing step, is illustrated in FIG. 4. Crystallized polysilicon layer 60 no longer has arsenic from layer 30 (FIG. 3) interspersed within it. Example conditions would be 907° C. for approximately 30 minutes. Lower temperatures could be utilizable for longer periods of time to sufficiently outgas the arsenic from the polysilicon layer. Such lower temperatures would, however, be greater than 600° C. The 600° C. crystallization step would result in very little, if any, outgasing of arsenic from the polysilicon. Where the silicon layer is first annealed at around 600°, the second annealing temperature will be effectively higher than the first annealing temperature. Where the silicon layer is first annealed at say 950° C. with an oxide cap, such as say for polysilicon recrystallization with arsenic, the second annealing temperature will not necessarily be greater than the first annealing temperature. The oxide capping layer deposited to prevent outgasing during the first anneal would be removed prior to the second anneal.

Ultimate removal of arsenic from the polysilicon is desired to enable a p-type implant to be provided. Even where n-type polysilicon is desired, the arsenic concentration imparted from the first layer would typically be excessively high and undesirable for thin film transistors. The second annealing temperature is preferably greater than about 900° C., enabling process time to be reduced, and therefor throughput to be maximized.

It will be noted from FIG. 1 that the slope of the curves of the respective films improves from 883 mV/dec (silicon deposition only) to 690 mV/dec (arsenic/silicon layered film). Such represents faster voltage on/voltage off switching, evidencing an increase in grain size. Also, the "off current" is reduced from 20 pA to 8 pA for such films. Such would be especially significant for thin film transistors for SRAM load applications, where the slope and the "off current" is an important parameter. There, the "off current" sets the "stand-by current" of the chip, and the slope ultimately determines the "on current" at Vg=Vd=Vcc.

Sheet resistance of the resultant films was also measured, with the arsenic/Si layered film having a sheet resistance factor of two lower than that for the control film. Further, Gm (maximum conductance of the thin film transistor) was a factor of two higher for the layered film. Both of these facts indicate a larger and more defective-free grain for the arsenic/silicon layered film.

In accordance with another aspect of the invention, a semiconductor processing method of providing a polysilicon layer atop a semiconductor wafer comprises the following sequential steps:

depositing a layer of substantially amorphous silicon atop a semiconductor wafer, such depositing step including exposing the wafer to arsenic during such deposition to in situ dope the amorphous silicon layer with arsenic to a concentration of at least about $1\times10^{17}$ arsenic atoms/cm$^3$, the layer of in situ doped amorphous silicon having an outer surface;

first annealing the wafer at a temperature of at least about 600° C. for a time period sufficient to crystallize the doped amorphous layer into polysilicon, the arsenic present in the amorphous silicon layer promoting growth of large polysilicon grains during such first annealing step; and with the outer surface being outwardly exposed, second annealing the wafer for a time period sufficient to outgas arsenic from the polysilicon layer.

The first annealing and second annealing are preferably conducted in accordance with that described above in accordance with the first aspect of the invention. In situ provision of arsenic within the amorphous silicon layer during its deposition would also inherently provide arsenic presence in the silicon layer to enhance grain grown, with such arsenic being later driven from the polysilicon layer. Example conditions for such in situ doping and deposition would include injecting arsine and silane into an LPCVD reactor at greater than 1 Torr and at a temperature of less than 585° C.

In accordance with yet another aspect of the invention, a semiconductor processing method of providing a polysilicon layer atop a semiconductor wafer comprising the following sequential steps:

depositing a layer of polycrystalline silicon atop a semiconductor wafer, such depositing step including exposing the wafer to arsenic during such deposition to in situ dope the polycrystalline silicon layer with arsenic to a concentration of at least about $1 \times 10^{17}$ arsenic atoms/cm$^3$, the layer of in situ doped polycrystalline silicon having an outer surface;

masking the outer polycrystalline silicon surface;

first annealing the wafer at a temperature of at least about 950° C. for a time period sufficient to impart growth of polycrystalline silicon grains in the polycrystalline silicon layer, the arsenic present in the masked polycrystalline silicon layer promoting growth of large polysilicon grains during such first annealing step;

removing the masking from the outer polycrystalline silicon surface; and with the outer surface being outwardly exposed, second annealing the wafer for a time period sufficient to outgas arsenic from the polysilicon layer.

Processing could otherwise proceed as described above with respect to the first two described aspects of the invention, with the masking material being an oxide or a nitride sufficient to prevent the out diffusion during the stated first annealing. First annealing temperature and time could be 950° C. and 30 or more minutes, respectively, by way of example.

A most significant advantage of this invention is believed to be that it provides an alternate and more effective route for producing large grains and passivation of grain boundaries in a polycrystalline film. Even prior art techniques which produce polysilicon films require a passivation-like step to eliminate defects, such as stacking faults, dislocations, microtwins, and dangling bonds. Such passivation-like steps typically comprise treatment of the wafer with hydrogen which fundamentally eliminates dangling bonds, but does not provide significant improvement to other such problems. Grain growth in the presence of arsenic apparently significantly reduces such other defects.

A second advantage of the invention is the improving of the interface between the resultant polysilicon film and the typical underlying gate oxide. The invention results in better transconductance, lower sheet resistance, better sub-threshold slope, and lower "off current" than current technology. The invention as well has the capability of reducing cycling time by eliminating separate passivation-like steps from the typical process flow.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of providing a polysilicon thin film transistor layer atop a semiconductor wafer comprising the following sequential steps:

depositing a first layer of arsenic atop a semiconductor wafer;

depositing a second layer of silicon over the arsenic layer, the second layer having an outer surface;

first annealing the wafer at a temperature of at least about 550° C. for a time period sufficient to impart growth of polycrystalline silicon grains in the second layer and providing a predominately polysilicon second layer, the first annealing step imparting diffusion of arsenic within the second layer to promote size growth of individual polysilicon grains; and with the second layer outer surface being outwardly exposed, outgassing arsenic from the polysilicon layer.

2. The semiconductor processing method of claim 1 wherein the first layer is deposited to a thickness of less than or equal to about 20 Angstroms.

3. The semiconductor processing method of claim 1 wherein the first layer is deposited to a thickness of less than or equal to about 5 Angstroms.

4. The semiconductor processing method of claim 1 wherein the first layer is deposited to a thickness of from about 1 Angstrom to about 2 Angstroms.

5. The semiconductor processing method of claim 1 wherein the second layer is deposited to a thickness of from about 300 Angstroms to about 400 Angstroms.

6. The semiconductor processing method of claim 1 wherein the outgassing is conducted at a temperature effectively higher than the first annealing temperature.

7. The semiconductor processing method of claim 1 wherein the outgassing is conducted at a temperature greater than about 900° C.

8. The semiconductor processing method of claim 1 wherein the second layer is deposited to a thickness of from about 300 Angstroms to about 400 Angstroms, and the outgassing is conducted at a temperature greater than about 900° C.

9. The semiconductor processing method of claim 1 wherein the first layer is deposited to a thickness of less than or equal to about 20 Angstroms, the second layer is deposited to a thickness of from about 300 Angstroms to about 400 Angstroms, and the outgassing is conducted at a temperature greater than about 900° C.

10. The semiconductor processing method of claim 1 wherein the second layer of silicon as deposited is substantially amorphous.

11. The semiconductor processing method of claim 1 wherein the second layer of silicon as deposited is substantially polycrystalline.

12. The semiconductor processing method of claim 1 wherein the first annealing temperature is about 600° C. and the outgassing is conducted at a temperature greater than about 900° C.

13. The semiconductor processing method of claim 1 wherein the first layer is deposited to a thickness of less than or equal to about 20 Angstroms, and the second layer of silicon as deposited is substantially polycrystalline.

14. A semiconductor processing method of providing a polysilicon thin film transistor layer atop a semiconductor wafer comprising the following sequential steps:

depositing a first layer of arsenic atop a semiconductor wafer to a thickness of less than or equal to about 5 Angstroms;

depositing a second layer of silicon over the arsenic layer to a thickness of from about 300 Angstroms to about 400 Angstroms, the second layer having an outer surface;

first annealing the wafer at a temperature of at least about 550° C. for a time period sufficient to impart crystallization in the second layer and providing a predominately polysilicon second layer, the first annealing step imparting diffusion of arsenic within the second layer to promote size growth of individual polysilicon grains; and outgassing arsenic from the wafer by second annealing the wafer at a temperature of at least about 900° C. for a time period sufficient to outgas arsenic from the polysilicon layer.

15. A semiconductor processing method of providing a polysilicon layer atop a semiconductor wafer comprising the following sequential steps:

depositing a first layer of arsenic atop a semiconductor wafer;

depositing a second layer of silicon over the arsenic layer, the second layer having an outer surface;

providing a capping layer atop the second layer outer surface to prevent arsenic out-diffusion from the second layer during a first annealing step;

first annealing the wafer at a temperature of at least about 550° C. for a time period sufficient to impart growth of polycrystalline silicon grains in the second layer and providing a predominately polysilicon second layer, the first annealing step imparting diffusion of arsenic within the second layer to promote size growth of individual polysilicon grains;

removing the capping layer; and with the capping layer being removed, outgassing arsenic from the polysilicon layer.

16. A semiconductor processing method of providing a polysilicon layer atop a semiconductor wafer comprising the following sequential steps:

depositing a first layer of arsenic atop a semiconductor wafer to a thickness of less than or equal to about 5 Angstroms;

depositing a second layer of silicon over the arsenic layer to a thickness of from about 300 Angstroms to about 400 Angstroms, the second layer having an outer surface;

providing a capping layer atop the second layer outer surface to prevent arsenic out-diffusion from the second layer during a first annealing step;

first annealing the wafer at a temperature of at least about 550° C. for a time period sufficient to impart crystallization in the second layer and providing a predominately polysilicon second layer, the first annealing step imparting diffusion of arsenic within the second layer to promote size growth of individual polysilicon grains; and removing the capping layer;

outgassing arsenic from the wafer by second annealing the wafer at a temperature of at least about 900° C. for a time period sufficient to outgas arsenic from the polysilicon layer.

\* \* \* \* \*